United States Patent [19]
Mitchell et al.

[11] Patent Number: 6,053,743
[45] Date of Patent: *Apr. 25, 2000

[54] CLIP FOR SURFACE MOUNT TERMINATION OF A COAXIAL CABLE

[75] Inventors: Jay R. Mitchell, Mesa; Matthew R. Michieli, Chandler, both of Ariz.

[73] Assignee: Motorols, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/882,770

[22] Filed: Jun. 26, 1997

[51] Int. Cl.⁷ .................................................. H01R 9/05
[52] U.S. Cl. .............................................. 439/63; 439/578
[58] Field of Search .................. 439/578, 579, 439/580, 581, 582, 583, 584, 585, 63; 343/906, 713

[56] References Cited

U.S. PATENT DOCUMENTS

| | | | |
|---|---|---|---|
| 3,514,737 | 5/1970 | Renshaw, Jr. | 439/63 |
| 3,915,535 | 10/1975 | O'Keefe et al. | 439/63 |
| 4,169,650 | 10/1979 | Schweizer | 439/581 |
| 4,684,200 | 8/1987 | Capp | 439/387 |
| 4,701,001 | 10/1987 | Verhoeven | 439/394 |
| 4,897,046 | 1/1990 | Tengler et al. | 439/579 |
| 5,235,492 | 8/1993 | Humbert et al. | 361/818 |
| 5,268,700 | 12/1993 | Hirotsu et al. | 343/713 |
| 5,334,050 | 8/1994 | Andrews | 439/579 |
| 5,336,112 | 8/1994 | Michishita et al. | 439/581 |
| 5,479,179 | 12/1995 | Hirotsu et al. | 343/713 |
| 5,482,477 | 1/1996 | Michael | 439/581 |
| 5,738,529 | 4/1998 | Wedell et al. | 439/63 |
| 5,879,190 | 3/1999 | Maruyama et al. | 439/582 |
| 5,904,578 | 5/1999 | Kubota et al. | 439/63 |

*Primary Examiner*—Paula Bradley
*Assistant Examiner*—Ross Gushi
*Attorney, Agent, or Firm*—Michael C. Soldner; John G. Rauch

[57] ABSTRACT

A clip (100) for surface mount termination includes a first conductor or retainer (102), a second conductor (104) and a dielectric element (106). The second conductor includes a center conductor contacting portion (144) defining a central bore (140) for receiving the center conductor (206) of a coaxial cable (202). The second conductor further includes a first flange (142) and a second flange (143) for mounting the clip to the surface (302) of a printed wiring board (300), thereby electrically terminating the cable at the printed wiring board.

15 Claims, 1 Drawing Sheet

CLIP FOR SURFACE MOUNT TERMINATION OF A COAXIAL CABLE

FIELD OF THE INVENTION

The present invention generally relates to electrical connectors. More particularly, the present invention relates to a surface mount termination clip for a coaxial cable.

BACKGROUND OF THE INVENTION

Electrical cables are used in conjunction with a printed wiring board (PWB) to conduct electrical signals between a location on the PWB and another location in the circuit. Such electrical cables typically include a center conductor surrounded by a dielectric or insulating layer. In a coaxial cable, the cable also includes a shield layer surrounding but electrically isolated from the center conductor.

In modern electronic devices, surface mount techniques are used to minimize the area required for mounting of components such as electrical cables. Components and cable terminations are soldered directly to the surface of the PWB, eliminating the space and expense required for plated-through solder holes. Also, surface mounted components may be placed automatically by a pick and place machine, reducing cost and time for manufacture and improving quality.

Previously, surface mount assembly of cables has been labor-intensive and prone to rejection for poor quality. At the manufacturer, cables are cut to size and the center conductor is formed by bending the center conductor at one or both ends. Forming is required for two purposes. The center conductor is bent in a direction from the center axis toward the edge of the jacket to provide planarity between the soldered portion of the center conductor and the jacket. The center conductor is also bent in a direction parallel to the surface of the PWB to minimize rolling of the cable during mounting to the surface. Rolling occurs using un-bent cables because the cable is round in cross section and the cable is soldered to surface mount pads rather than plated through holes. Cables are bent in specified orientations to reduce the effect of rolling and provide planarity.

Cables handled in this manner are often rejected as not meeting quality control requirements. Many such cables are extremely thin. The center conductor is as small as 0.002–0.003 inches. In the process of forming the end and subsequently handling the cable, the center conductor may be damaged or broken. The required coplanarity of the center conductor and the jacket may be disturbed. Any of these may cause the cable assembly to be rejected.

One previous apparatus for attaching coaxial cables to a PWB surface requires two separate connectors. One connector attaches to the PWB and the other attaches to the cable. The two connectors are then joined at the time of assembly. Use of two separate connectors increases the expense and labor of assembly, requires additional time for assembly and creates another failure mechanism, as the two connectors may not make adequate connection. This previous apparatus has not been a satisfactory solution to the surface mount problem.

Accordingly, there is a need in the art for an improved surface mount termination for coaxial and other cables.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like numerals identify identical elements, and wherein:

DETAILED DESCRIPTION OF A PREFERRED EMBODIMENT

Figure 1:
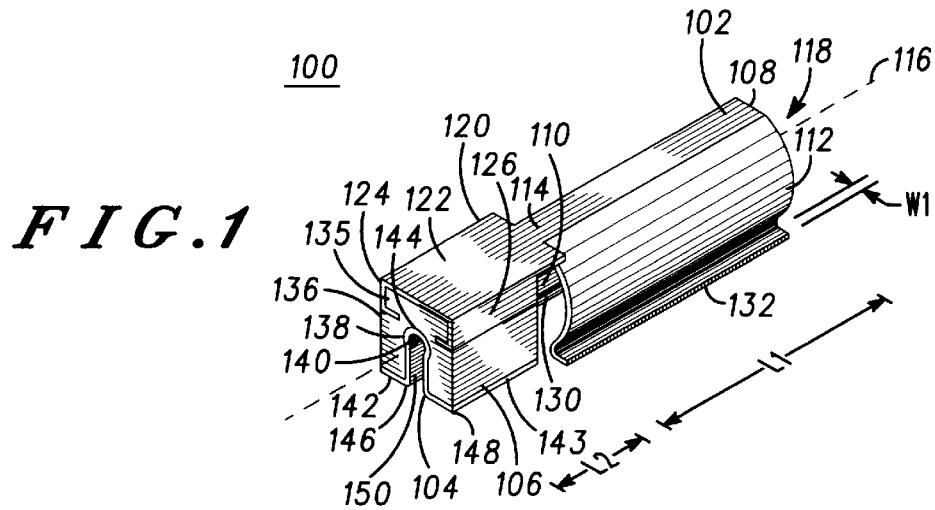
FIG. 1 is an isometric view of a clip for surface mount termination of a cable.

Referring now to FIG. 1, a clip 100 for surface mount termination to a printed wiring board includes a first conductor or retainer 102, a second conductor 104 and a dielectric element 106. The clip 100 is envisioned for use with cables including coaxial cables which communicate electrical signals in electronic equipment such as a portable radio. The cable and clip together form a cable assembly. Either the retainer 102 or the second conductor 104 and preferably both are to be attached to the surface of the printed wiring board. Surface mounting by soldering is preferred but other methods of attachment may also be used.

The retainer 102 includes a first arm 110 and a second arm 112 extending from a base 108 to form a channel 118 sized for snap-fit retention of the cable. The first arm 110 and the second arm 112 extending from the base 108 are generally arcuate in shape. The first arm 110 and the second arm 112 define the shape of the channel 118. The channel 118 may be any suitable shape but is preferably sized and shaped to conform to the outer surface of the cable to be retained by the clip 100. Cables including coaxial cables are typically substantially round in cross section, and that is the shape of the first arm 110, second arm 112 and channel 118 illustrated in FIG. 1. The diameter of the channel 118 is chosen to be approximately the same as or slightly less than the diameter of the cable, so that the cable will be securely retained in the channel 118. The retainer is preferably formed from a somewhat elastic material, such as a beryllium copper alloy to flex for snap-fit retention.

The first arm 110 and the second arm 112 have a length L1. This length may be chosen to be any suitable length, such as 1 cm. The chosen value will correspond to factors such as the diameter of the cable to be retained or the area available for surface attachment of the clip 100.

The first arm 110 includes a first flange 130 and the second arm 112 includes a second flange 132. Each of the first flange 130 and the second flange 132 has a width W1 sufficient for secure attachment to the surface of a printed wiring board, for example by soldering. Each of the first flange 130 and the second flange 132 is formed by turning the respective arm outwardly, away from the axis 116. Alternatively, the flange may be formed by turning the arm inwardly, toward the axis 116. The outward turning is preferred because it creates an open-ended channel which guides the cable into the channel 118 as the cable and clip are assembled. In alternative embodiments, only a single arm of the first arm 110 and the second arm 112 are turned to form a flange. This is preferred when surface mount space is too limited to permit surface attachment of both arms. The flanges, whether on both arms or a single arm, form a flange portion of the retainer 102. The flanges serve to reduce the tendency of a cable assembly including the clip 100 to roll during mounting on a printed wiring board.

The clip 100 is suitable for use with either semi-rigid coaxial cable or flexible coaxial cable. In semi-rigid coaxial cable, a hard, metallic outside cover or jacket provides an electrical shield for the center conductor. The center conductor and metallic jacket are electrically isolated by a dielectric layer. In a flexible coaxial cable, the external jacket is non-conductive. A braided shield layer is contained within the external jacket, separated from the center conductor by a dielectric layer. Such coaxial cables have a characteristic impedance, such as 50 ohms. The clip 100 may be used with other types of cables as well.

For use with a semi-rigid coaxial cable, the retainer 102, at the first arm 110 and the second arm 112, makes direct electrical contact with the metallic jacket of the cable. The metallic jacket, which is the shield for the coaxial cable, is then electrically connected to the surface of the printed wiring board to ground the shield by soldering the first flange 130 and the second flange 132 to the board. For use with flexible coaxial cable, a portion of the insulating jacket may be stripped from the cable so that the braided shield contacts the inner surface of the first arm 110 and the second arm 112. The braided shield is grounded by soldering the first flange 130 and the second flange 132 to the surface of the printed wiring board.

The retainer 102 further includes an axial arm 114 extending from the base 108 along the axis 116 of the clip 100. The axial arm 114 terminates in a gripping portion 120 which is configured to grip and retain the dielectric element 106.

The gripping portion 120 includes a substantially flat surface 122, a first extension 124 and a second extension 126. The first extension 124 and the second extension 126 are turned inward toward the axis 116 to grip the dielectric element 106. The dielectric element 106 may be secured to the retainer 102 in any other suitable way, such as by adhesive. The illustrated gripping portion 120 provides the advantage of being secure under all conditions, including the thermal environment of soldering, and being inexpensive to manufacture. The flat surface 122 provides a surface for attachment of a surface mount tool, such as a vacuum tool, for automated pick and place of the clip 100 or a cable assembly including the clip 100. The opportunity for automated pick and place reduces the manufacturing cost and manual labor requirements for assembly of an electronic device such as a portable radio which uses the clip 100.

The dielectric element 106 is manufactured from any suitable material which electrically insulates the retainer 102 from the second conductor 104. One such suitable material is liquid crystal polymer (LCP) plastic, which is heat resistant for applications involving soldering of clip 100 and has good dielectric properties. The dielectric element 106 has a securing portion 136 and defines a hollow 138. The securing portion 136 is shaped for securing to the gripping portion 120. Any suitable junction between these elements is used, such as a snap-fit, adhesive, or crimped junction. In the illustrated embodiment, the dielectric element 106 is pliable or plastic in nature for easing gripping by the first extension 124 and the second extension 126 of the gripping portion 120 and for secure retention of the dielectric element 106. The second conductor 104 is disposed within the hollow 138. Again, any suitable junction is used for attaching the second conductor 104 and the dielectric element 106. In the illustrated embodiment, the hollow 138 is shaped to conform to the outer surface of the second conductor 104 and sized slightly smaller so that the second conductor 104 is press-fit into the hollow 138 in the pliable dielectric element 106 and securely retained there. In applications where the clip 100 is to be soldered to the surface of a printed wiring board, the dielectric element 106 and its respective junctions with the retainer 102 and the second conductor 104 should be able to withstand soldering temperatures without damage or deformation.

The second conductor 104 is generally keyhole shaped and formed from a single piece of conductor in the illustrated embodiment. The second conductor 104 makes electrical contact between the surface of the printed wiring board and a center conductor segment from which the jacket of the cable has been removed. The second conductor 104 includes a center conductor contacting portion 144, a first finger 146 and a second finger 148. The center conductor contacting portion is shaped to contact a portion of the perimeter of the center conductor segment. In the illustrated embodiment, the center conductor contacting portion 144 is shaped to define a central bore 140. The central bore 140 is sized to receive the center conductor of a cable retained in the clip 100. Accordingly, the central bore 140 should have the same diameter or a slightly larger diameter than the center conductor.

The center conductor contacting portion 144 is shaped to contact as much of the perimeter of the center conductor as possible. It is envisioned that the center conductor and the center conductor contacting portion 144 will be soldered to form a cable assembly. Other suitable methods of joining these elements are used as well. By maximizing the contacting surfaces of the center conductor and the center conductor contacting portion 144, the electrical contact is maximized between the two, thereby minimizing the electrical resistance. Moreover, maximizing the contacting surfaces also maximizes the mechanical strength of the joint, whether the joint is soldered or otherwise connected.

In the illustrated embodiment, the center conductor contacting portion 144 wraps around the central bore 140 so that, in conjunction with the first finger 146 and the second finger 148, the center conductor contacting portion 144 defines a pinched opening 150. The pinched opening 150 has a width that is smaller than the diameter of the center conductor. Thus, during and after assembly, the center conductor cannot inadvertently slip out of the central bore 140 but is retained in the central bore 140. This reduces the number of cable assemblies that must be rejected for poor quality.

The first finger 146 includes a first finger flange 142 and the second finger 148 includes a second finger flange 143. The first finger flange 142 and second finger flange 143 together define a flange portion for attachment of the second conductor 104 to the surface of the printed wiring board. One of the first finger flange 142 and second finger flange 143 may be omitted from the flange portion, for example in applications where available surface area on the printed wiring board is limited. However, use of both flanges is preferred to ensure good electrical and mechanical contact. Moreover, use of both flanges increases the resistance of a cable assembly including the clip 100 to rolling when the cable assembly is being mounted on a printed wiring board.

The second conductor 104 has a length L2. This length is chosen to be any suitable value, such as 0.5 cm. This length may be affected by such factors as available surface area on a printed wiring board and electrical and mechanical design rules for surface mount components.

In accordance with the present invention, the first finger 146 and the second finger 148 extend from the center conductor contacting portion 144 for electrically connecting the center conductor segment and the surface of the printed wiring board. In this manner, the cable is electrically terminated at the printed wiring board. Preferably, they extend a distance sufficient for the center conductor to be retained in the central bore 140 without bending or otherwise deforming the central conductor. By eliminating the need to deform the central conductor, the present invention eliminates an important failure mechanism in many cables. Since the central conductor can be very thin, deforming causes mechanical weakness and even breakage. Moreover, deforming causes increased electrical resistance which, in high-current applications, causes localized heating which can also cause mechanical weakness. Since the center conductor of a cable used with the clip 100 need not be deformed, these failure mechanisms are eliminated.

In the preferred embodiment, the clip 100 provides an electrical impedance to match the impedance of the cable retained by the clip 100. Typical cable impedance is 50 ohms, so the retainer 102, the second conductor 104 and the dielectric element 106 are designed to match this impedance.

Further in accordance with the present invention, the retainer 102, the second conductor 104 and the dielectric element 106 are integrally formed as a one-piece assembly. To form a cable assembly, the clip 100 need only be slipped over an end of a cable from which part of the jacket has been removed to expose a center conductor segment. The first flange 142 and the second flange 143 are then soldered to the surface of a printed wiring board. For additional mechanical strength and to make electrical connection between the shield of the cable and the printed wiring board, the first flange 130 of the first arm 110 and the second flange 132 of the second arm 112 of the retainer 102 may be soldered to the printed wiring board as well. Thus, the clip for surface mount termination of a cable in accordance with the present invention reduces parts count over previous cable terminations that used two connectors. This reduces parts count and parts cost and reduces assembly time.

Figure 3:
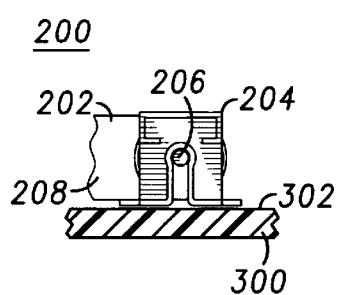
FIG. 3 is an end elevation view of the cable assembly of FIG. 2 shown in relation to a printed wiring board.
Figure 2:
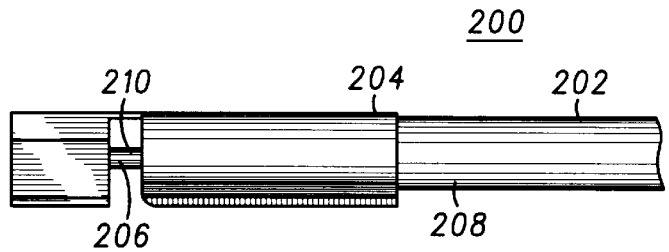
FIG. 2 is a side elevation view of a portion of cable assembly employing the clip of FIG. 1.
Figure 4:
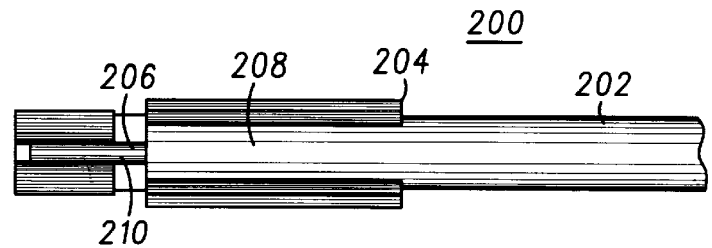
FIG. 4 is a bottom elevation view of the cable assembly of FIG. 2.

In FIG. 2, FIG. 3 and FIG. 4, a cable assembly 200 includes a coaxial cable 202 having a predetermined length and a clip 204. Only one end of the cable assembly 200 is shown in FIGS. 2–4. The other end also includes a clip such as clip 204 or is otherwise terminated. FIG. 3 shows the cable assembly 200 in relation to a printed wiring board 300. The clip 204 may be mounted to a surface 302 of the printed wiring board 300. The clip 204 is substantially similar to the clip 100 illustrated in FIG. 1.

The coaxial cable 202 has a center conductor 206 surrounded by a jacket 208. If the coaxial cable 202 is a semi-rigid coaxial cable, the jacket 208 has a metallic, electrically conducting outside cover. If the coaxial cable 202 is a flexible coaxial cable, the coaxial cable 202 includes a braided metallic shield which is coaxial with the center conductor 206 and which is also surrounded by the jacket 208, which is an insulating jacket. A portion of the jacket 208 is removed to expose a center conductor segment 210.

In the illustrated embodiment, the retainer of the clip 204 forms an attachment member having a securing portion sized for secure attachment to a portion of the cable. The first arm and the second arm of the retainer form an electrical contact between the shield of the coaxial cable 202 and the printed wiring board 300. If the coaxial cable 202 is a flexible coaxial cable, a portion of the jacket 208 which surrounds and insulates the braided shield, is stripped away to allow mechanical and electrical contact between the braided shield and the retainer of the clip 204. The second conductor of the clip 204 is integrally formed with the attachment member, the retainer, and has a contacting portion for electrically contacting a center conductor of the cable proximate an end of the cable and a flange portion for electrical connection to a surface of the printed wiring board.

As can be seen from the foregoing, the present invention provides a clip for surface mount termination of a coaxial or other cable and a cable assembly using the clip. Flanges provide a sure electrical and mechanical connection and prevent rolling of the cable during surface mounting. A dielectric element electrically isolates the electrical connection of the cable jacket from the center conductor. The cable is terminated to the surface of the printed wiring board without the need to deform the center conductor. This reduces the additional tooling and setups required to form the cable and reduces damage to the cable that formerly occurred during cable manufacture, shipment and assembly.

While a particular embodiment of the present invention has been shown and described, modifications may be made. It is therefore intended in the appended claims to cover all such changes and modifications which fall within the true spirit and scope of the invention.

What is claimed is:

1. A clip for surface mount termination of a cable to a surface of a printed wiring board, the clip comprising:

a first conductor having a securing portion sized for secure attachment to a portion of the cable; and a second conductor having a first finger and a second finger extending from a contacting portion having a central bore shaped to contact a perimeter of a center conductor of a cable and for electrically contacting the center conductor proximate an end of the cable, the contacting portion and the first and the second finger retaining the center conductor in the central bore, and a flange portion integrally formed with at least one of the first finger and the second finger for electrical connection to the surface of the printed wiring board without extending through the surface of the printed wiring board.

2. A clip as recited in claim 1 wherein the first conductor further comprises a flange portion substantially coplanar with the flange portion of the second conductor for connection to the surface of the printed wiring board.

3. A clip as recited in claim 2 wherein the first conductor further comprises an electrically conductive portion for electrical connection between a jacket of the cable and the surface of the printed wiring board.

4. A clip as recited in claim 3 further comprising a dielectric element for electrically isolating the electrically conductive portion and the second conductor.

5. A clip for surface mount termination of a cable to a surface of a printed wiring board, the clip comprising:

a first conductor having a retainer sized to securely engage an outer surface of the cable and an axial arm extending along an axis of the cable from the retainer;

a second conductor having a first finger and a second finger extending from a contact portion having a central bore shaped to contact a perimeter of a center conductor of a cable and for electrically connecting the center conductor and the surface of the printed wiring board without deforming the center conductor, the contact portion and the first and the second finger retaining the center conductor in the central bore, and a flange integrally formed with at least one of the first finger and the second finger for electrical connection to the surface of the printed wiring board without extending through the surface of the printed wiring board; and a dielectric element disposed between the axial arm and the second conductor.

6. A clip as recited in claim 5 wherein the retainer includes a flange portion for mechanical connection to the printed wiring board.

7. A clip as recited in claim 6 wherein the cable has a center conductor surrounded by a jacket and wherein the second conductor mechanically engages a portion of a center conductor segment from which the jacket has been removed and extends from the center conductor segment to contact the surface of the printed wiring board without deforming the center conductor.

8. A clip for surface mount termination of a cable to a surface of a printed wiring board, the cable including a jacket surrounding a center conductor, the clip comprising:

a first conductor including a first arm and a second arm extending from a base to form a channel sized for snap-fit retention of the jacket; and a second conductor extending from the base, the second conductor having a center conductor contacting portion with an integrally formed attachment flange and a central bore shaped to contact a perimeter of a center conductor of a cable and shaped for electrical contact between a portion of the center conductor from which the jacket has been removed and the surface of the printed wiring board without penetrating the surface of the printed wiring board, the center conductor contact portion and the integrally formed attachment flange retaining the center conductor in the central bore.

9. A clip as recited in claim 8 wherein the second conductor further comprises a first finger and a second finger extending from the center conductor contacting portion, at least one of the first finger and the second finger extending to the attachment flange to contact the surface of the printed wiring board.

10. A clip as recited in claim 9 wherein the first finger and the second finger include integrally formed respective finger flange portions, at least one of the finger flange portions forming the attachment flange for attachment to the surface of the printed wiring board.

11. A clip as recited in claim 10 wherein the first finger and the second finger include respective finger flange portions for attachment to the surface of the printed wiring board.

12. A cable assembly comprising:

a coaxial cable having a predetermined length, the coaxial cable including a jacket surrounding a center conductor, a portion of the jacket being removed to expose a center conductor segment at one end of the coaxial cable;

a clip including a first conductor sized to securely engage an outer surface of the jacket;

an arm extending from the first conductor along an axis of the coaxial cable; and a second conductor, having a center conductor contacting portion with an integrally formed attachment flange and a central bore, shaped to contact a perimeter of a center conductor of a cable, the second conductor extending from the arm for electrically connecting the center conductor segment and a surface of a printed wiring board without deforming the center conductor and without-penetrating the surface of the printed wiring board, the center conductor contacting portion and the integrally formed attachment flange retaining the center conductor in the central bore.

13. A cable assembly as recited in claim 12 wherein the second conductor further comprises a first finger and a second finger extending from the center conductor contacting portion, at least one of the first finger and the second finger extending to the attachment flange to contact the surface of the printed wiring board.

14. A cable assembly as recited in claim 13 wherein the first finger and the second finger include integrally formed respective finger flange portions for attachment to the surface of the printed wiring board at least one of the finger flange portions forming the attachment flange.

15. A cable assembly as recited in claim 14 wherein the first conductor includes a base and a first arm and a second arm extending from the base to form a channel sized for snap-fit retention of the jacket, the first arm and the second arm each including a respective arm flange portion substantially coplanar with the respective finger flange portions for attachment to the surface of the printed wiring board.

\* \* \* \* \*